US 6,522,124 B1
(12) United States Patent  (10) Patent No.: US 6,522,124 B1
Ballard                   (45) Date of Patent:     Feb. 18, 2003

(54) SNAP CONNECTING INNER MODULES FOR AN ELECTRIC UTILITY METER

(75) Inventor: Henry Ballard, Easley, SC (US)

(73) Assignee: Schlumberger Resource Management Services, Inc., Norcross, GA (US)

(*) Notice: Subject to any disclaimer, the term of this patent is extended or adjusted under 35 U.S.C. 154(b) by 0 days.

(21) Appl. No.: 09/704,255

(22) Filed: Nov. 1, 2000

(51) Int. Cl.⁷ .............. G01R 1/04; B65D 6/28; H02B 1/00
(52) U.S. Cl. ............. 324/157; 324/156; 324/103 R; 220/4.02; 361/659
(58) Field of Search .................. 324/156, 157, 324/110, 103 R, 104; 361/659, 663, 644; 73/431; 312/223.1; 220/4.02

(56) References Cited

U.S. PATENT DOCUMENTS

| | | |
|---|---|---|
| 3,843,013 A | 10/1974 | Brooks, Jr. |
| 3,846,677 A | 11/1974 | Keever et al. |
| 3,928,788 A | 12/1975 | Finnen et al. |
| 3,943,441 A * | 3/1976 | Shackford .............. 324/110 |
| 3,955,021 A | 5/1976 | Cleavenger |
| 4,065,020 A | 12/1977 | Carson |
| 4,121,147 A * | 10/1978 | Becker et al. .............. 324/104 |
| 4,146,258 A | 3/1979 | Andruchiw |
| 4,153,176 A | 5/1979 | Carson |
| 5,088,004 A | 2/1992 | Howell |
| 5,503,271 A | 4/1996 | Lynch |
| 5,529,353 A | 6/1996 | Kuo |
| 5,789,672 A | 8/1998 | Rogers et al. |
| 5,966,010 A | 10/1999 | Loy et al. |
| 6,084,395 A * | 7/2000 | Thiel .............. 324/156 |

* cited by examiner

Primary Examiner—N. Le
Assistant Examiner—Anjan K. Deb
(74) Attorney, Agent, or Firm—Dority & Manning, P.A.; Leonard W. Pojunas, Jr., Esq.

(57) ABSTRACT

An integrated structure that offers improved casing for an electric utility meter is disclosed. The improved structure uses a minimum number of parts required for proper functionality of a meter casing, and excludes the use of screws, clips or other additional parts that make meter disassembly a tedious procedure. The meter casing generally includes a baseplate, at least two inner covers for housing and protecting electronic components for an electric utility meter, an outer cover, and pluralities of projections extending from the covers for interconnection of casing components and stabilization of the integrated casing structure. The various electronic components of the meter generally include electronic circuit boards and current transformers. The various projections enable snap-fit connections between the baseplate and an inner cover, between inner covers, and between inner covers and an outer cover. The specific projections utilized for snap-connecting an inner cover to the baseplate include rivets and corresponding rivet bosses. Securing the inner covers together incorporates the use of snaps, locator pins and holes, and adjacent flange members. The casing module is secured and stabilized by interconnecting the outer cover with the other inner covers, thus safeguarding against possible snap deflection. The additional use of cantilever springs and containment ribs helps to ensure that the inner casing components will not move within the overall casing structure.

37 Claims, 12 Drawing Sheets

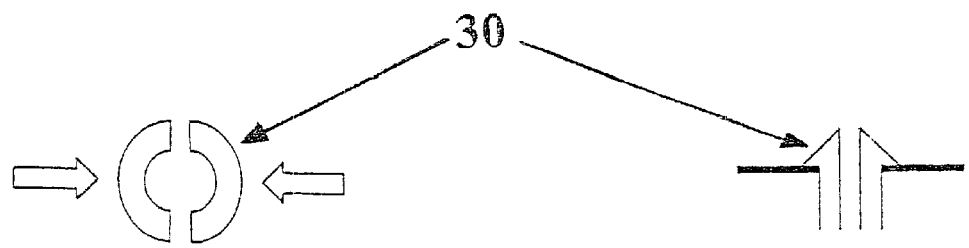
*FIG. 2A*
PRIOR ART
*FIG. 2B*
PRIOR ART
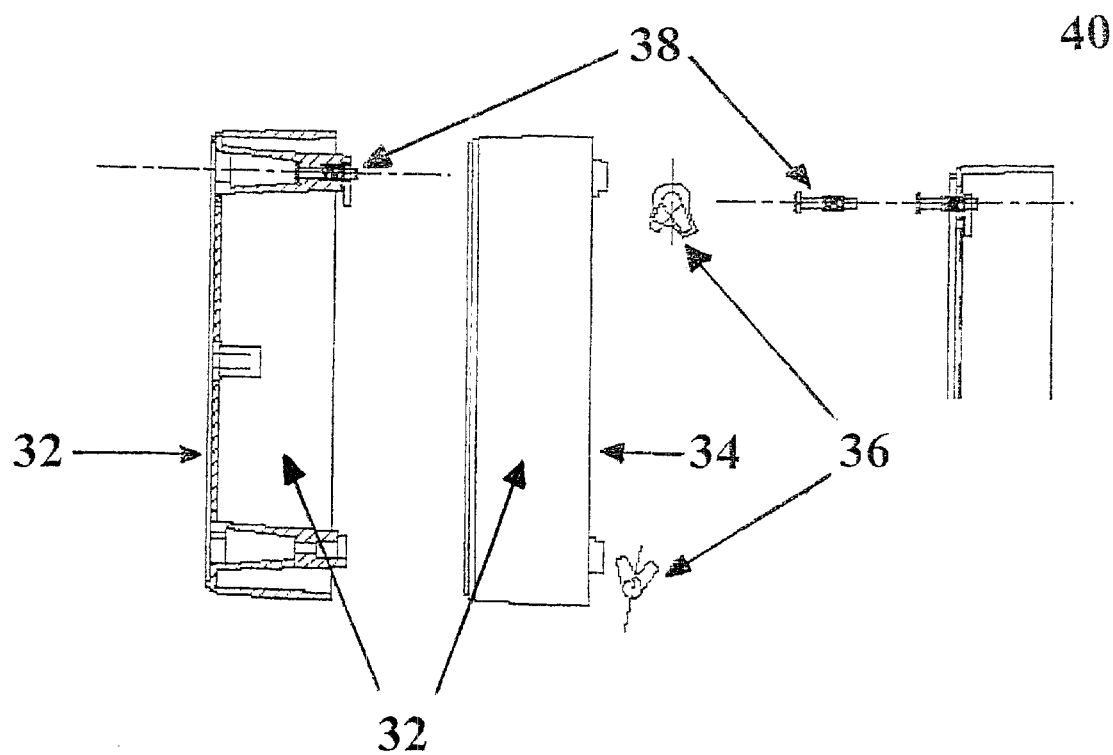
*FIG. 3*
PRIOR ART

SNAP CONNECTING INNER MODULES FOR AN ELECTRIC UTILITY METER

BACKGROUND OF THE INVENTION

The present invention generally concerns improved casing components for electric utility meters and, more particularly, concerns a meter casing assembly with snap-connecting inner modules that are secured and stabilized by an outer cover that encloses the inner modules.

There are a wide variety of utilized designs that offer a means for casing the components of an electric utility meter. Any number of such designs may be employed depending on specific applications of such a meter, including the commercial environment in which a meter is exposed.

It is typically ideal to construct a meter casing that is easily assembled as well as disassembled to ensure ready access to internal components of an electric meter. Potential accessibility of a meter once it has an established location in the field is aided by several design characteristics. It is desired to utilize a minimum number of parts needed to accomplish full functionality of an electric utility meter casing. It may also be ideal to exclude component parts in a meter casing assembly such as screws or clips, since such parts may be difficult to remove and could easily be misplaced.

Another inherent goal of an electric utility meter casing is to provide adequate protection of its internal components. Such protection is achieved through utilization of various meter casing components, and the stability of such casing components is essential to ensuring proper protection. A utility meter may endure significant movement of its internal and external components during shipping or installation or if accidentally dropped. It is thus ideal to provide a fully stabilized meter casing that ensures safeguarded protection of a meter's components.

Present meter designs are known to include pancake-like casing components that house the electronic circuit boards of an electric utility meter. These "pancakes" are stacked on top of one another and held in place by rotating latches, which are operated by screws. Thus, in order to access any of the lower circuit boards (or pancakes), each pancake would need to be unlatched and removed. This characteristic makes for a difficult disassembly process and also incorporates undesired connective parts.

Another application of the above-referenced meter casing utilizes a "twisting" design, whereby similar circular pancakes are stacked then twisted together. However, a disadvantage to this design is that only an annular detent prevents the uppermost pancake from rotating. Dropping the meter, or even mere shipping, could "untwist" the inner pancakes and loosen the connections. This would not be visible unless the outer cover was actually removed. Thus, the stability of such a meter casing is not properly ensured.

Another known meter casing design provides a method for snapping the meter's circular inner modules together. In order to ensure that the snaps do not deflect inwards on their own accord (thereby releasing the modules from one another), clips, or additional parts, are incorporated to slide behind the snaps and hold them in place. Such clips are difficult to remove and might be misplaced in the field.

Yet another known meter casing design makes use of tapered mounting posts and various snap fit features for providing a stable meter construction without requiring screws or other additional fastener elements. However, the outer cover of this casing design, as well as that of the other designs referenced herein, plays no role in stabilizing the inner casing modules.

While various aspects and alternative casing features are known in the electric utility meter field, no one design has emerged that generally encompasses all of the above-referenced ideal assembly characteristics.

SUMMARY OF THE INVENTION

In view of the discussed drawbacks and shortcomings encountered in the prior art, an improved utility meter casing has been developed. Thus, broadly speaking, a general object of the invention is improved casing structure for an electric utility meter.

It is another general object of the present invention to provide an electric utility meter casing assembly with inner modules that are snap-connected together and subsequently stabilized by an outer cover.

It is a principal object of the present invention to provide an electric utility meter casing including inner covers that are used to house and protect various electronic components of an electric utility meter.

It is a further principal object of the present invention to provide a plurality of projections extending from inner covers of a meter for mutually interconnecting the inner covers.

It is another principal object of the present invention to provide an electric utility meter casing including an outer cover that encloses the inner covers and mutually interconnects with at least one of the inner covers, providing a stabilized modular casing assembly.

It is another principal object of the present invention to provide an electric utility meter casing that is easily assembled and consequently easily disassembled in the event that a meter casing need to be removed for access to or repair of specific electronic components of a meter.

It is yet another principal object of the present invention to provide an electric utility meter casing that incorporates a minimum number of parts to accomplish full functionality.

It is a further principal object of the present invention to provide an electric utility meter casing that does not involve loose parts that are easily lost or misplaced, such as screws or clips, thereby providing field technicians with easier access to a meter.

It is another object of the present invention to provide enhanced structural stability between inner covers of an electric utility meter casing, such stability achieved through the use of pairs of pins and mating holes as well as the use of interconnected adjacent flanges extending from selected of the inner covers.

It is another object of the present invention to provide an electric utility meter casing that restricts undesired movement of inner components, achieved by securing the snap-connections of inner covers between flanges and an outer cover.

It is another object of the present invention to ensure the restriction of undesired movement of inner components, achieved by the use of cantilevered springs and containment ribs that eliminate any gaps between inner and outer casing components.

Additional objects and advantages of the invention are set forth in, or will be apparent to those of ordinary skill in the art from, the detailed description herein. Also, it should be further appreciated that modifications and variations to the specifically illustrated, referred and discussed features hereof may be practiced in various embodiments and uses of this invention without departing from the spirit and scope thereof, by virtue of present reference thereto. Such variations may include, but are not limited to, substitution of equivalent means and features for those illustrated, referenced or discussed, and the functional, operational or positional reversal of various parts, features or the like.

Still further, it is to be understood that different embodiments, as well as different presently preferred embodiments, of this invention may include various combinations or configurations of presently disclosed features or elements, or their equivalents (including combinations of features or parts or configurations thereof not expressly shown in the figures or stated in the detailed description). One exemplary such embodiment in the present invention relates to an electric utility meter casing. Such arrangement may comprise a baseplate, a first inner cover, at least a second inner cover, an outer cover and a plurality of various projections extending from selected of the inner covers.

More preferably, the inner covers house and protect various electronic components for an electric utility meter. The inner cover projections are utilized for mutually interconnecting selected of the inner covers together. Ideally, the outer cover also mutually interconnects with at least one of the inner covers.

Another present exemplary embodiment of the present invention concerns an electric utility meter with selected casing components. Such utility meter in combination may variously comprise a baseplate, a first inner casing component, baseplate securement means, at least a second inner casing component, inner casing securement means, an outer casing component, and outer casing securement means.

More preferably, the baseplate and first inner casing component both include a plurality of openings to accommodate baseplate securement means interconnecting the two components. The baseplate securement means ideally utilizes rivets that are passed through the baseplate openings and the first case openings. The inner casing securement means includes a plurality of projections extending from selected of the inner casing components. Furthermore, the outer casing securement means involves the use of containment extensions projecting from selected of the inner casing components to which an outer cover is connected.

Yet another exemplary embodiment of the present invention involves an electric utility meter that includes various combinations of the foregoing casing features, further including various electronic components for use in an electric utility meter. Ideally such electronic components would include a combination of electronic circuit boards and current transformers.

Still further exemplary embodiments of the present invention involve various combinations of the foregoing features, further including flanges extending from the inner covers, a plurality of ribs and snaps for removably securing selected inner and outer covers together, and cantilevered springs and containment ribs for preventing movement of components within the modular casing assembly. In such embodiments and others, further features may be provided in varying combinations concerning the snap-connecting securement of selected components together in a modular electric utility meter casing assembly.

Additional embodiments of the subject invention, not necessarily expressed in this summarized section, may include and incorporate various combinations of aspects of features or parts referenced in the summarized objectives above, and/or other features or parts as otherwise discussed in this application.

Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 2A illustrates a top view of an exemplary snap closure utilized in a known electric utility meter assembly;

FIG. 2B illustrates a side view of an exemplary snap closure utilized in a known electric utility meter assembly;

FIG. 3 illustrates an exploded side view of an exemplary electric utility meter assembly including a known orientation of selected meter components and a means for securing such selected components in combination;

Figure 1:
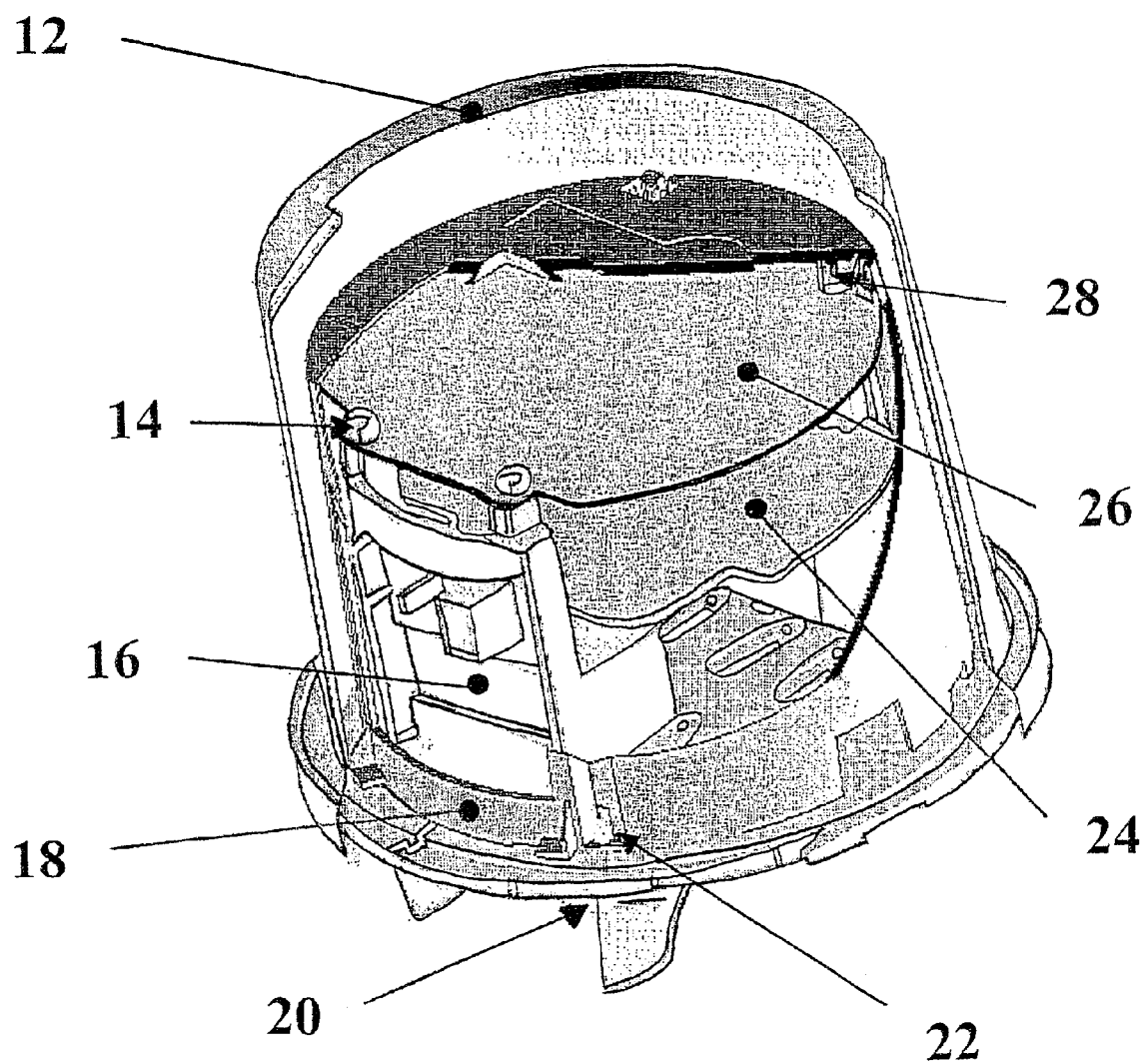
FIG. 1 illustrates a cutaway view of a known electric utility meter assembly including a known means for securing printed wire boards in the meter assembly.

Repeat use of reference characters throughout the present specification and appended drawings is intended to represent same or analogous features or elements of the invention.

DETAILED DESCRIPTION OF THE DRAWINGS

Figure 5:
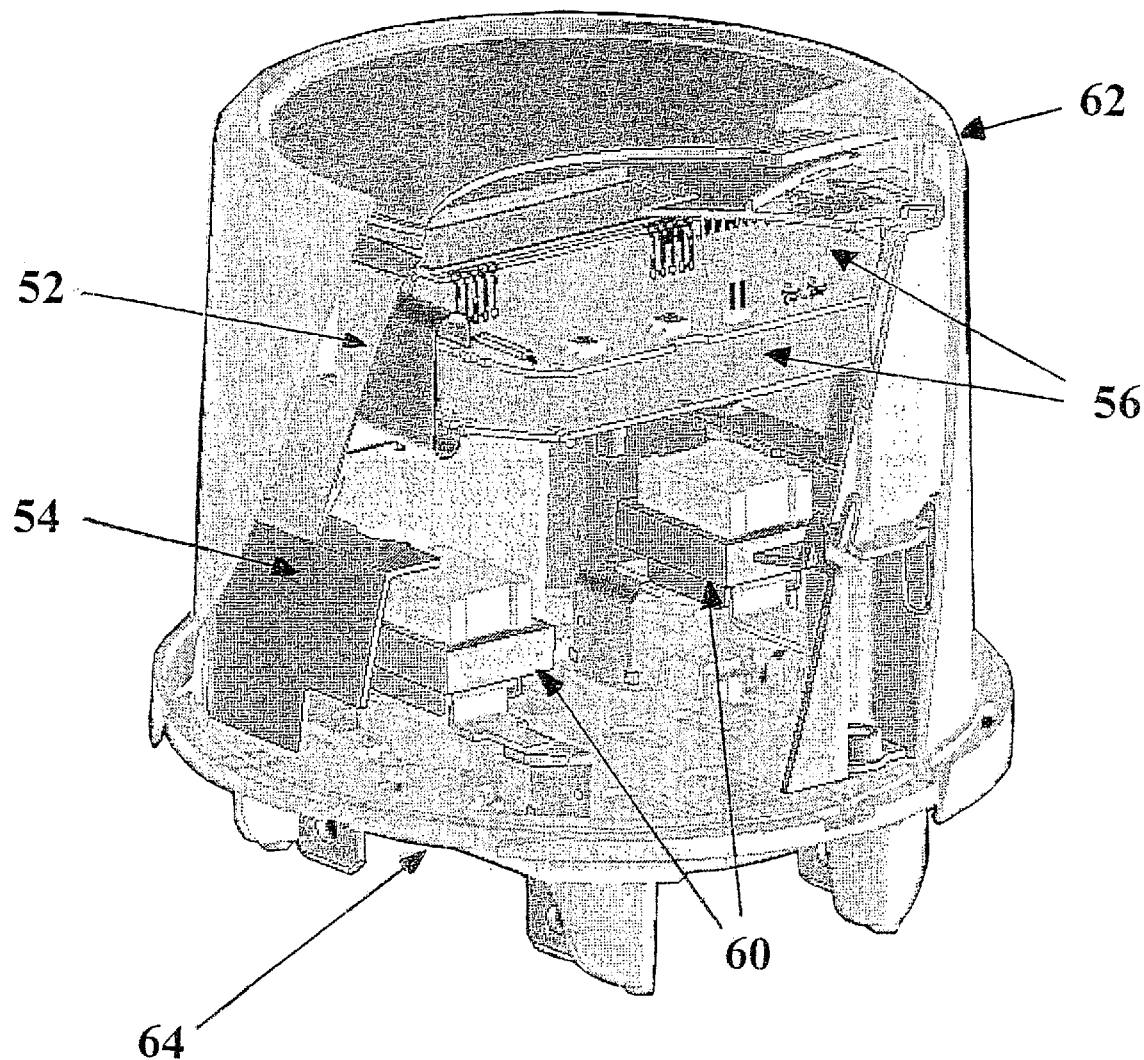
FIG. 5 illustrates a generally front sectional view, with slight top perspective, of an exemplary embodiment of the subject invention, including electronic components and enclosure within an external, or outer cover.
Figure 6:
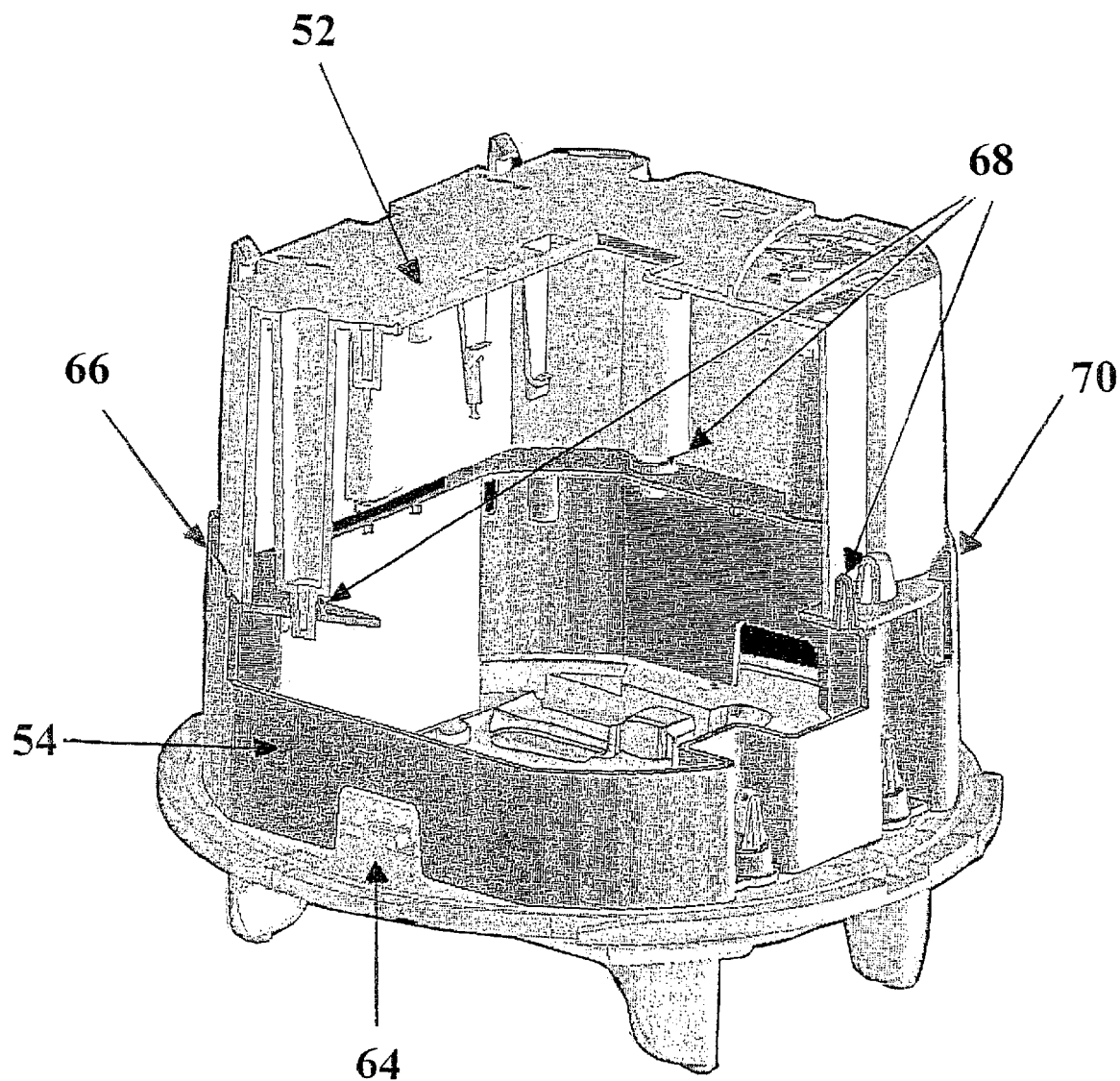
FIG. 6 illustrates a generally front sectional view, with slight top perspective, of an additional exemplary embodiment of the subject invention, in isolation from internal electronic components thereof, and in isolation from an outer cover thereof.

As discussed in the summary of the invention, the present invention is particularly concerned with improved electric utility meter casing design. Known utility meter designs incorporate varying combinations of components to offer specific functionality of meter casings. There are several specific characteristics of such previous designs that are disclosed in FIGS. 1 through 4 and are described in detail herein. FIG. 5 illustrates an exemplary embodiment of the subject invention, including electronic components and enclosure within an external cover. FIG. 6 illustrates an additional exemplary embodiment of the subject invention, in isolation from internal electronic components and from an outer cover. FIGS. 7 through 13B illustrate exemplary casing components and features for use in either of the above referenced embodiments of the subject invention.

It should be noted that each of the exemplary embodiments should not insinuate limitations of the invention. Features illustrated or described as part of one embodiment can be used on another embodiment to yield a still further embodiment. Additionally, certain features may be interchanged with similar devices or features not mentioned yet which perform the same or similar function.

Reference will now be made in detail to the presently preferred embodiments of the invention. Referring to the drawings, FIGS. 1 and 2 illustrate exemplary components utilized in a known electric utility meter embodiment. FIG. 1 illustrates an exemplary electric utility meter assembly 10 that functions in a manner conducive for securing a maximum of two printed wire boards (PWBs). This assembly specifically utilizes two electronic circuit boards, a display PWB 26 and an option PWB 24. The lower, option PWB 24 sits mid-way between two cardholders 16 extending from the baseplate 20 of the meter. Each cardholder 16 has two hollow, slotted posts protruding upward forming snaps 14. The main display PWB 26 on top has four holes through which the ends of posts are inserted and snapped into place. Next, the PWB cover 18 is positioned over the PWB(s) and cardholders 16 and it also has rods that are inserted into the snaps 14 locking them into a secure position. The PWB cover 18 is compressed at its base to form an oblong shape so that it can be fitted over two catches 22 on the base of each cardholder 16. In the assembly process, the cardholders 16 are affixed to the baseplate 20 with screws while holding the option PWB 24 between the cardholders 16. Next, the display PWB 26 is lowered over the cardholder snaps 14, which locks the option PWB 24 in place. Subsequently, the PWB cover 18 is placed over the PWBs and the cardholders 16 with their rods inserted into the cardholder snaps 14 (which secures the display PWB 26). The cover 12 is deflected sufficiently to clear the cardholder catches 22 located near the base 20. There is a PWB cover pin 28 in one of the cardholder snaps 14 that aids in positioning the PWB cover 18 over the cardholder assembly. Once the outer cover 12 is assembled, the PWB cover 18 cannot be deflected sufficiently to release from the cardholder catches 22. Note that the outer cover 12 does not directly touch or support the inner PWB cover 18.

FIGS. 2A and 2B illustrate exemplary snap closures 30 for an electric utility meter assembly 10 such as that illustrated in FIG. 1. These snap closures 30 provide a removable connection between the PWB cover 18 and the cardholder 16. In order to remove the top PWB, the outer cover 12 and PWB cover 18 are removed and each snap 14 on the cardholder 16 has to be compressed together before the board can be released from the snap 14.

Figure 4:
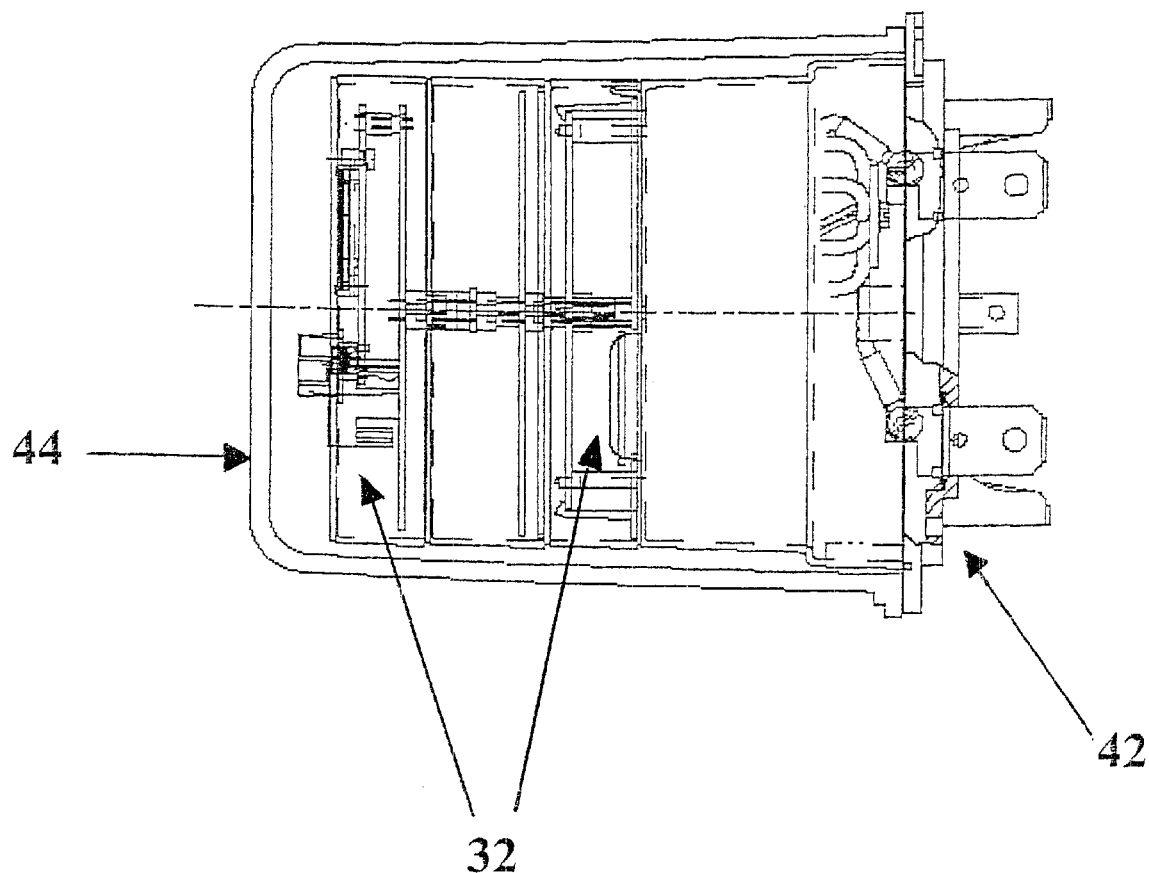
FIG. 4 illustrates a side view of an exemplary electric utility meter assembly including known interconnection between a meter baseplate and an outer cover.

FIGS. 3 and 4 illustrate exemplary components utilized in an additional known electric utility meter embodiment. FIG. 3 depicts an electric utility meter assembly 40 utilizing a pancake-like assembly. Each pancake 32 houses one electronic circuit board and stacks upon the pancake below it. Each pancake 32 must be held in place by a rotating latch 36 that is operated by a screw 38. Thus, in order to access any of the lower boards, or pancakes, each pancake 32 would need to be unlatched and removed.

FIG. 4 illustrates the assembled electric utility meter components 40 referred to in FIG. 3 in combination with a baseplate 42 and an outer casing 44. The outer meter cover 44 surrounds the entire assembly 40 and twists into place at the base 42 of the meter as shown. Note that the outer meter cover 44 does not directly touch or support the inner casings 32.

FIG. 5 illustrates an exemplary embodiment 50 of the subject invention, including electronic components and enclosure within an external or outer cover 62. Two inner covers house and protect various electronic components that may be included in an electric utility meter. More specifically, a lower inner cover 54 houses current transformers 60 and an upper inner cover 52 houses printed wire boards 56. The printed wire boards (PWBs) typically include a register PWB and a power supply PWB. The upper inner cover 52 is secured to the lower inner cover 54 which is in turn secured to a baseplate 64. The inner covers are both enclosed by and interconnected with an outer cover 62.

FIG. 6 illustrates an additional exemplary embodiment of the subject invention, in isolation from internal electronic components and in isolation from an outer cover 62. To assemble the upper inner cover 52 to the lower inner cover 54, locator holes and pins 68 are aligned axially, then the upper cover 52 is pushed down onto the lower cover 54. Four snaps 70 are located at each corner of the lower inner cover 54. The snap 70 deflects out from the lower cover 54 and snaps over projections extending from the upper cover 52. A containment rib 66 aids in securing the interconnection of upper and lower covers. Sets of locator pins and holes 68 help to create a significant structural member at the interface of the two inner covers.

Figure 7:
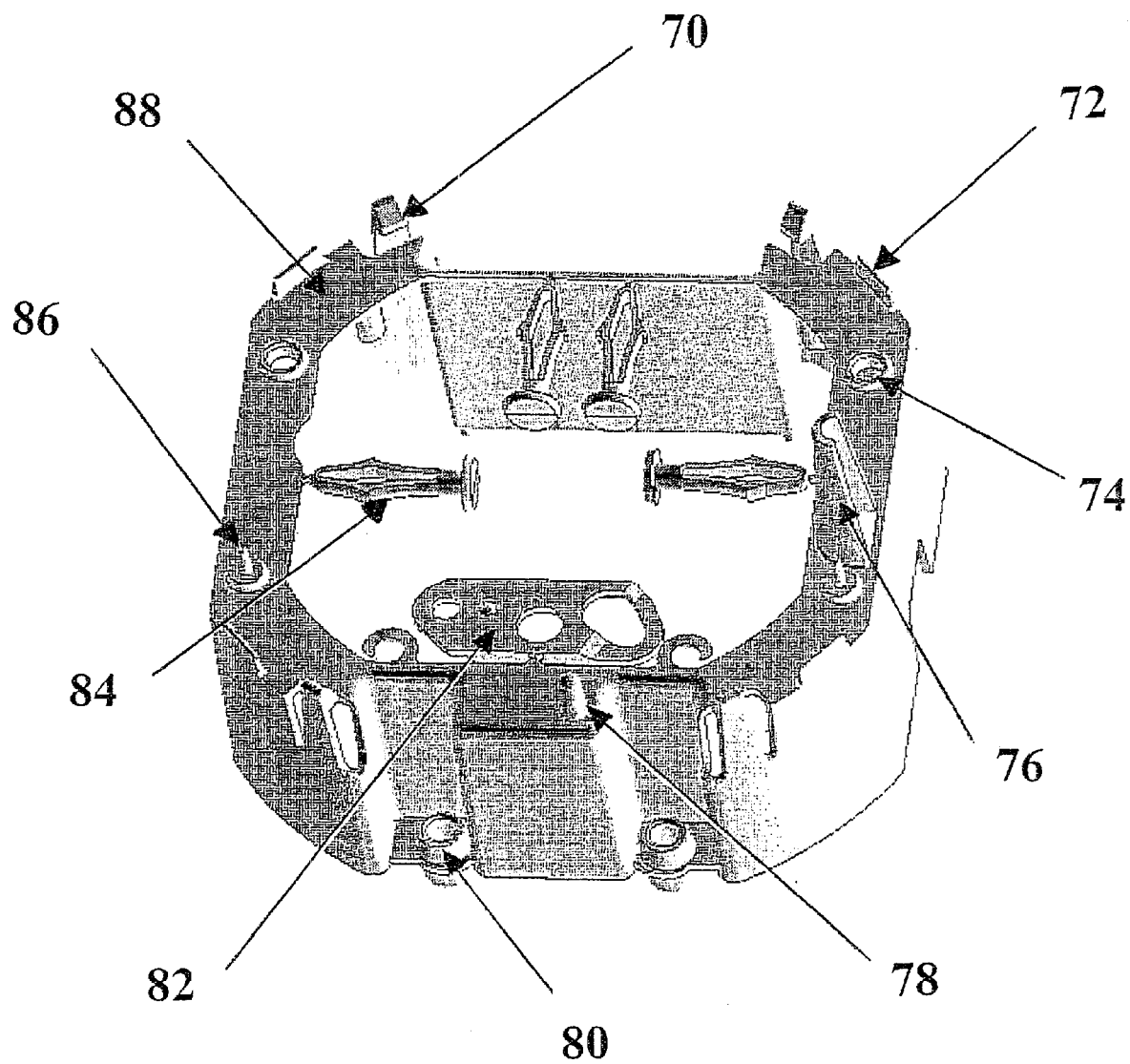
FIG. 7 illustrates a generally front and partially top perspective view of an exemplary first inner cover and additional exemplary parts for use in an electric utility meter assembly.

FIG. 7 illustrates an exemplary first inner cover 54 and additional exemplary parts for use in an electric utility meter assembly. Incorporated into the lower inner cover 54 are four snap-rivets 84 and a hanger 82. These snap-rivets 54 and hanger 82 are removed from the lower cover 54 in the assembly process before the cover 54 is placed over the baseplate assembly. Snap-rivet bosses 80 are located at the base of the lower inner cover 54 for snap-connecting a snap-rivet 84 into its corresponding location. Additionally, the lower cover 54 forms a platform for the upper inner cover 52 to reside with two vertical and one small horizontal flange 88. Each vertical flange 88 contains a locating hole 74 that mates with its respective pin in the upper inner cover 52 during assembly and an option board pin 86 that helps position and support an option board if used. There is one locator pin 78 on the flange 88 that also mates with a locator hole on the upper cover 52. At each of the rounded corners there is a snap 70 that holds the upper inner cover 52 in place as well as raised ribs 72 that locate and constrain the upper inner cover 52. Lastly, there is a containment column 76 protruding upward from the left vertical flange 88 which captures the power supply PWB in the final assembly.

Figure 8:
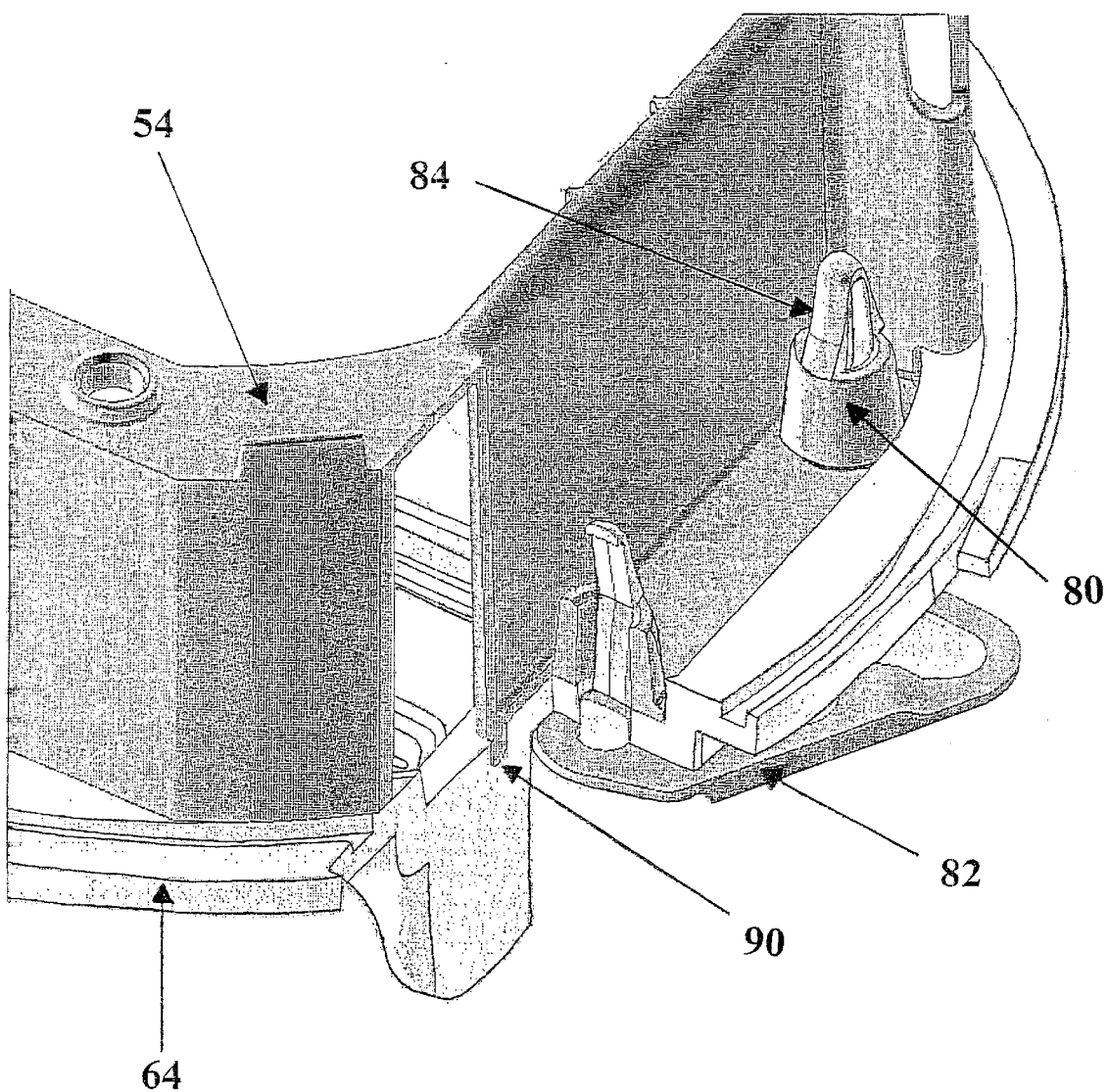
FIG. 8 illustrates a generally top sectional view of an exemplary interconnection between a first inner cover and a baseplate.

FIG. 8 illustrates an exemplary first inner cover 54 interconnected with an exemplary baseplate 64. To assist in the assembly of the lower cover 54 to the baseplate 64, four small pins 90 protrude from the bottom of the lower cover 54 to locate and orient the lower cover 54 to the baseplate 64. One of the snap-rivets 84 is passed through the hanger 82, then through the appropriate hole in the baseplate 64, and then through a snap-rivet boss 80 in the lower cover 54. The remaining three snap-rivets are then passed through the remaining holes of the baseplate 64 and cover 54. As these snap-rivets 84 bottom out in their respective holes on the baseplate 64, they snap outward and latch onto the top of each snap-rivet boss 80 on the lower cover 54.

Figure 9:
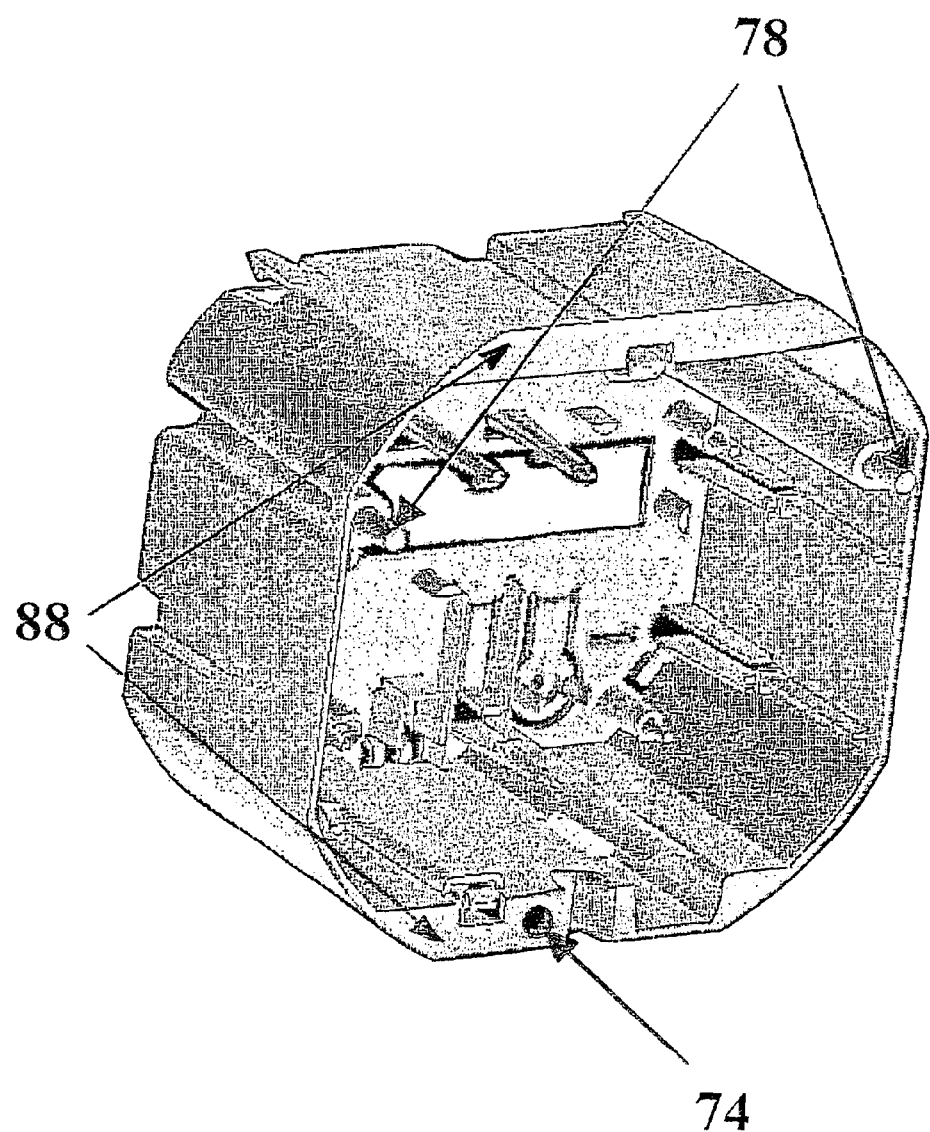
FIG. 9 illustrates a generally bottom view of an exemplary second inner cover utilized in an electronic utility meter assembly.

FIG. 9 illustrates an exemplary upper inner cover 52 utilized in an electronic utility meter assembly 50. As described previously, there are two locator pins 78 that mate with locator holes in the lower cover 54. There is also a locator hole 74 in the upper cover 52 that receives the locator pin of the lower cover 54. Additional flanges 88 are located on the upper inner cover 52 to complement the flanges 88 found in the lower cover. The two sets of flanges are oriented perpendicular to one another, offering lateral stability once the two covers are connected together.

Figure 10:
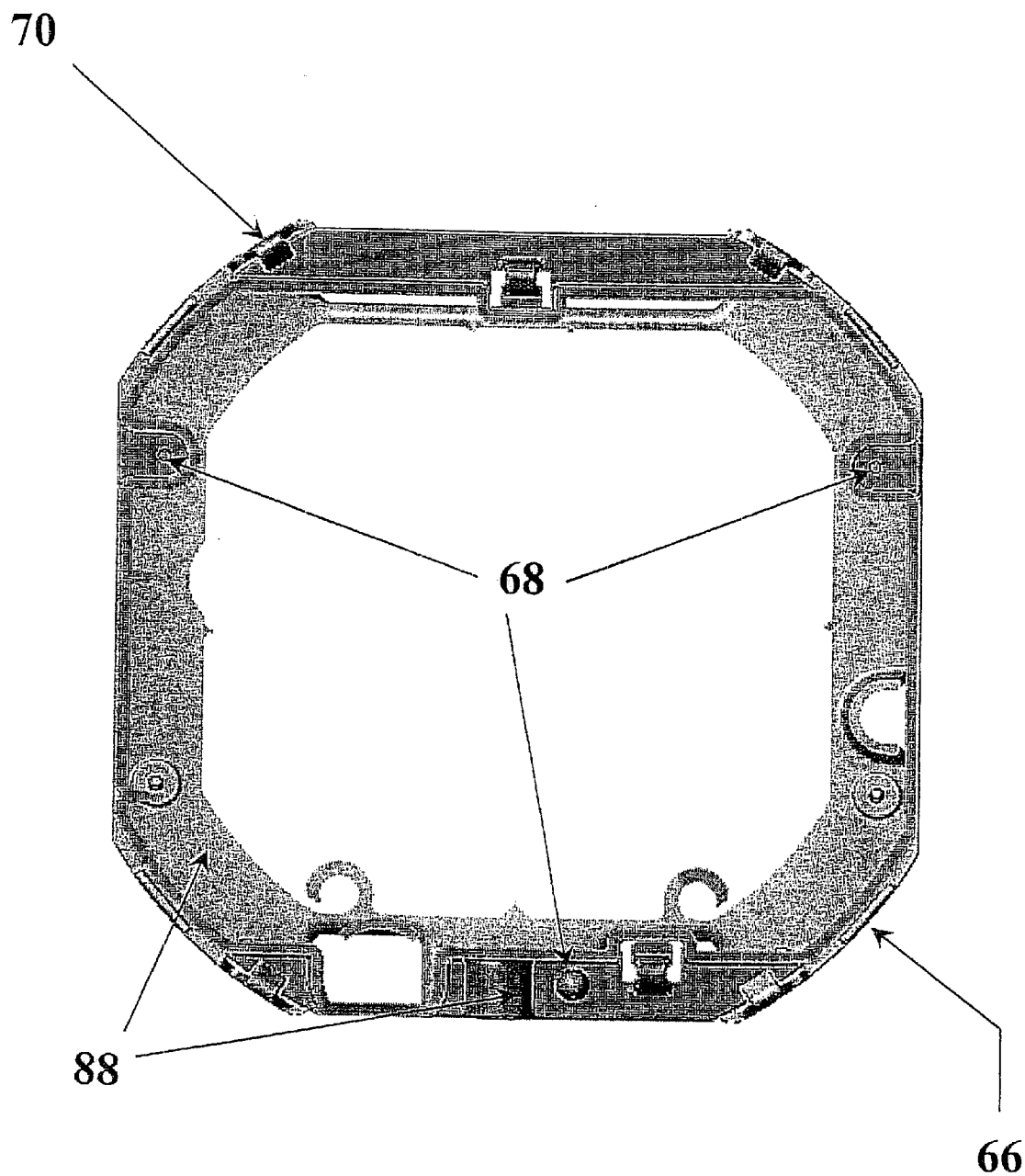
FIG. 10 illustrates a generally bottom sectional view of an exemplary interconnection between inner covers of an electric utility meter.

FIG. 10 illustrates an exemplary interconnection between inner covers of an electric utility meter 50, especially focused on the interconnection of adjacent flanges 88. The arrangement of the two perpendicular sets of flanges 88 with mating pairs of locator pins and holes 68 creates a significant structural member at the interface of the two covers. The pairs of locator pins and holes 68 not only assist in the assembly process, but also provide structural integration between the two members. Moreover, the containment ribs 66 found at each corner enhance this integration. The snaps 70 hold the two parts together and provide a connection that is further strengthened in the final assembly.

Figure 11:
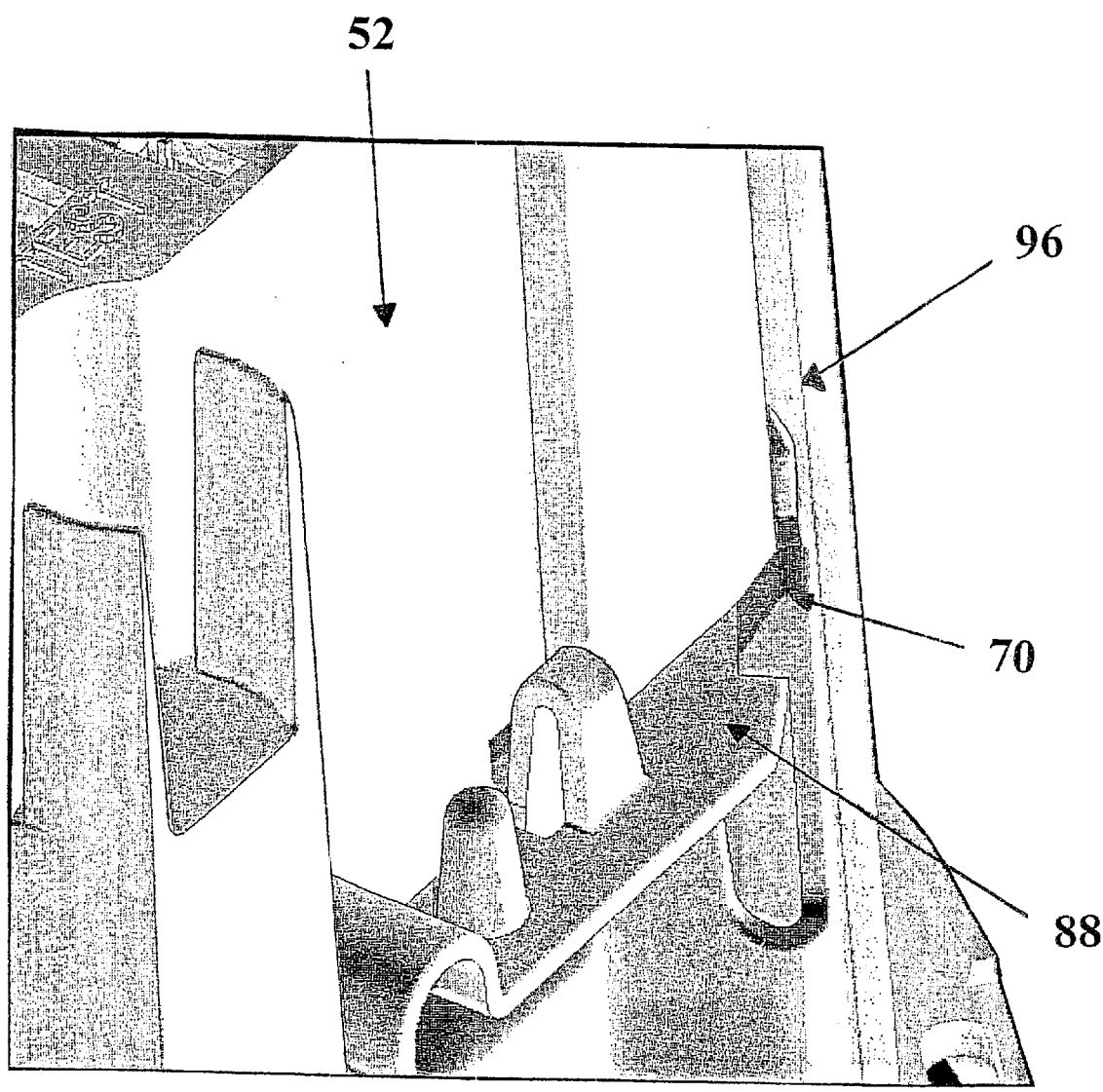
FIG. 11 illustrates a generally side sectional view of an exemplary interaction among an outer cover and internal casing components of an electric utility meter.

FIG. 11 illustrates an exemplary interaction among an outer cover 62 and internal components of an electric utility meter. This interaction is specifically designed to keep the snaps 70 from deflecting outward on their own, allowing the two inner covers to come apart. The outer cover 62 is utilized to capture the snaps 70 of the inner covers. There is only a small clearance between the inner surface 96 of the outer cover 62 and the flanges 88 that accommodates assembly. This clearance will not allow the snaps 70 sufficient movement to release the upper inner cover 52 from the lower inner cover 54.

Figure 12:
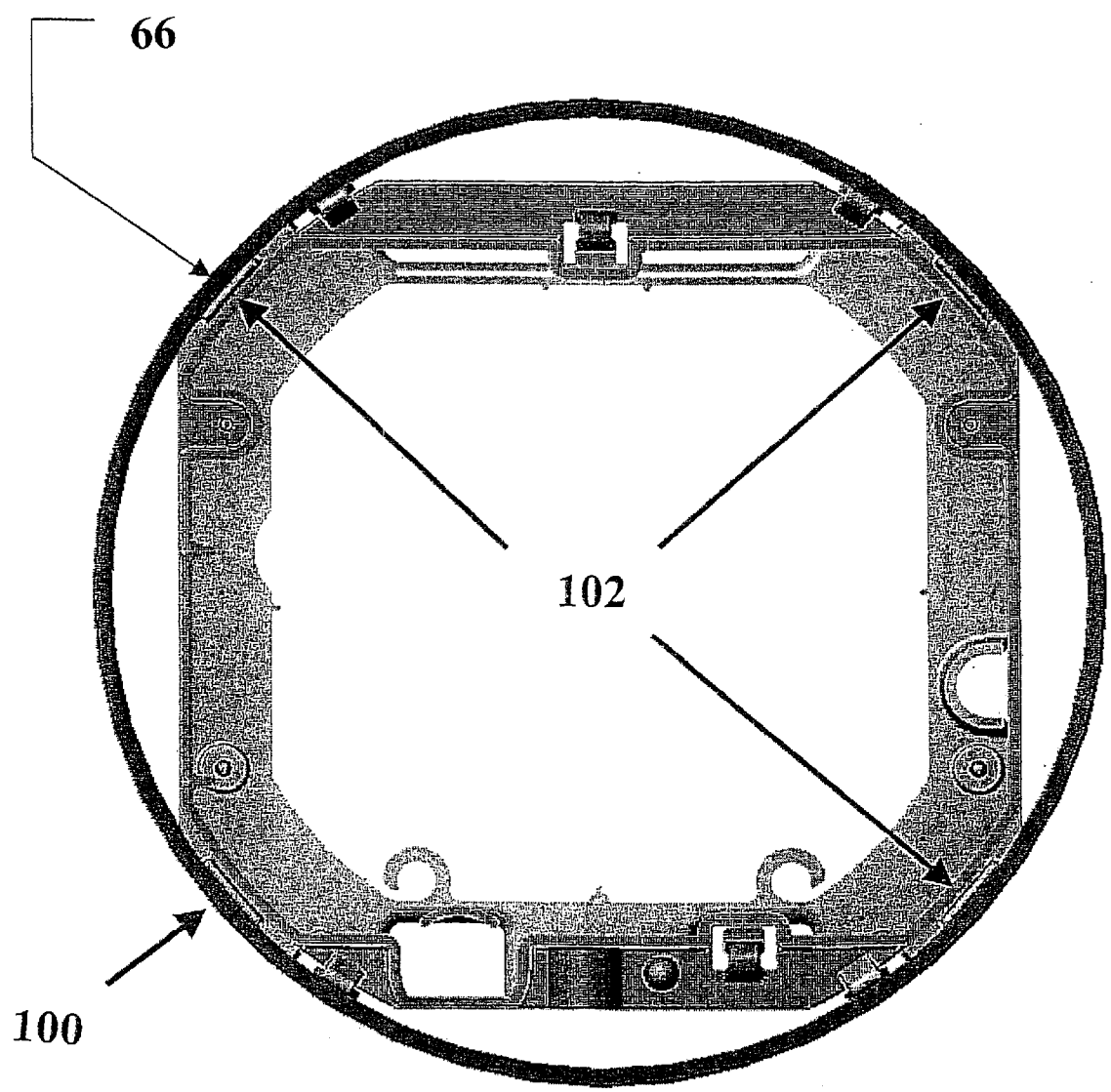
FIG. 12 illustrates an exemplary containment design for utilization in an electric utility meter casing.

FIG. 12 illustrates an exemplary containment design for utilization in an electric utility meter casing 50. In order to keep the upper inner cover 52 from deflecting inward at the snaps 70, the flanges 88 with the pairs of pins and holes 68 provides overall lateral stability, and four containment ribs 66 on the lower cover 54 encapsulate the upper cover 52 to give overall stability. If a load 100 were applied to one of the corners (for example, if hit or dropped), then the covers would have a tendency to deflect inward at the point of application. Similarly, the other three corners would tend to deflect outward 102. However, the opposing containment ribs 66 in conjunction with the outer cover 62 would counteract such an occurrence, keeping the upper cover flanges from slipping out from underneath the snaps 70.

Figure 13A:
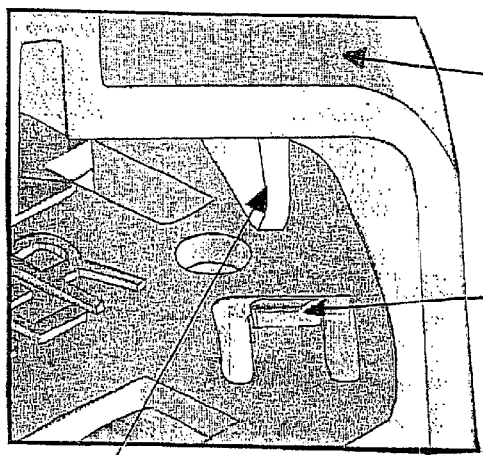
FIG. 13A illustrates a generally top sectional view of an exemplary interconnection between inner and outer covers of an electric utility meter.
Figure 13B:
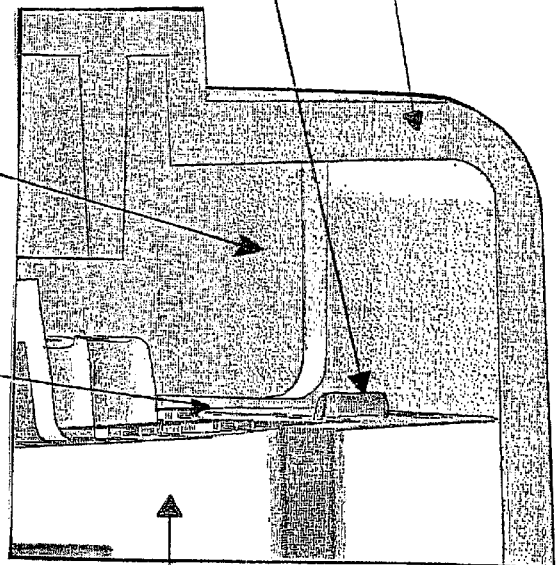
FIG. 13B illustrates a generally side sectional view of an exemplary interconnection between inner and outer covers of an electric utility meter.

FIG. 13A and 13B illustrate an exemplary interconnection between an inner and outer cover of an electric utility meter. Such an outer cover 62 has containment ribs 104 that protrude toward and mate with two small cantilever springs 108 that are built into the upper inner cover 52. As the outer cover 62 is assembled, these ribs 104 rotate over the springs 108, compressing them to eliminate any gaps 106 that exist between upper inner cover 52 and lower inner cover 54 as well as between lower inner cover 54 and baseplate 64. The ribs 104 in the outer cover 62 only have sufficient clearance to the upper inner cover to operate the springs 108 during assembly. In this manner, any tendency of the two inner modules to move axially away from the baseplate 64 under the influence of force would restricted. The flat surface of the upper inner cover would contact the ribs 104 of the outer cover 62, limiting the possibility of undesired component movement.

While the invention has been described in detail with respect to specific embodiments thereof, it will be appreciated that those skilled in the art, upon attaining an understanding of the foregoing may readily conceive of alterations to, variations of and equivalents to these embodiments. Accordingly, the scope of the present invention should be assessed as that of the disclosed variation and any equivalents thereto.

What is claimed is:

1. An electric utility meter casing, comprising:
   a baseplate;
   a first inner cover connected to said baseplate, for housing and protecting electronic components for an electric utility meter;
   at least a second inner cover for respectively housing and protecting additional electronic components for an electric utility meter;
   a plurality of inner cover projections extending from selected of said inner covers for mutually interconnecting said inner covers; and
   an outer cover for enclosing said inner covers and mutually interconnecting with at least one of said inner covers.

2. An electric utility meter casing as in claim 1, wherein said inner cover projections comprise:
   a plurality of locator ribs and snaps for securing selected of said inner covers together; and
   a plurality of locator pins.

3. An electric utility meter casing as in claim 2, further including a plurality of receptacles located on selected of said inner covers for mating with selected of said locator pins.

4. An electric utility meter casing as in claim 3, further including a plurality of containment ribs extending from selected of said inner covers, securing at least one of said inner covers to said outer cover.

5. An electric utility meter casing as in claim 3, further including flanges extending from said inner covers, said flanges connected to flanges of adjacent of said inner covers, providing lateral stability of said inner covers.

6. An electric utility meter casing as in claim 1, further including rivets for connecting said first inner cover to said baseplate.

7. An electric utility meter casing as in claim 6, further including at least one containment rib for extending from said outer cover for mating with at least selected one of corresponding said cantilevered springs to restrict movement of said inner cover within said outer cover.

8. An electric utility meter casing as in claim 1, further including at least one cantilevered spring extending from selected of said inner covers.

9. An electric utility meter casing as in claim 1, wherein electronic components comprise at least one electronic circuit board and at least one current transformer.

10. An electric utility meter with selected casing components, comprising:
    a baseplate with a plurality of baseplate openings to accommodate securement thereto of additional of selected casing components;
    a first inner casing component, said first inner casing component including a plurality of first casing openings to accommodate means for securing said first inner casing component to said baseplate;

baseplate securement means for securing said baseplate to said first inner casing component, said baseplate securement means including rivets passed through said baseplate openings and said first casing openings;

at least a second inner casing component;

inner casing securement means for removably securing selected of said inner casing components together, said inner casing securement means including a plurality of projections extending from at least one of said inner casing components;

an outer casing component enclosing said inner casing components; and outer casing securement means for removably securing said outer casing component to selected of said inner casing components, said outer casing securement means including a plurality of containment extensions projecting from selected of said inner casing components.

11. An electric utility meter as in claim 10, wherein said inner casing components house and protect electronic components for said electric utility meter, including at least one electronic circuit board and at least one current transformer.

12. An electric utility meter as in claim 10, wherein said baseplate securement means, said inner casing securement means, and said outer casing securement means include snap-connecting components for affecting securement thereof.

13. An electric utility meter as in claim 12, wherein said inner casing securement means comprises a plurality of locator ribs and snaps for mutually interconnecting selected of said inner casing components together.

14. An electric utility meter as in claim 12, further including:

at least one cantilevered spring extending from selected of said inner casing components; and at least one containment rib extending from said outer casing component, for mating with selected of corresponding said cantilevered springs, and forming an arrangement restricting movement of said inner casing component within said outer casing component.

15. An electric utility meter as in claim 10, wherein said first casing openings comprise bosses through which said rivets are passed to form a snap-fit connection between said first inner casing component and said baseplate.

16. An electric utility meter as in claim 10, further including flanges extending from selected of said inner casing components, said flanges connected to flanges of adjacent of said inner casing components, providing lateral stability of said inner casing components.

17. An electric utility meter as in claim 10, further including locator pins extending from selected of said inner casing components.

18. An electric utility meter as in claim 17, further including a plurality of receptacles located on selected of said inner casing components for mating with selected of said locator pins, for establishing a pre-determined alignment of selected of said inner casing components and for enhancing structural stability of said inner casing components.

19. An electric utility meter as in claim 17, further including a plurality of receptacles located on said baseplate for mating with selected of said locator pins, for establishing a pre-determined alignment of said first inner casing component and said baseplate.

20. An electric utility meter, comprising:
(a) electronic components including:
    (1) at least one electronic circuit board; and
    (2) at least one current transformer; and
(b) an enclosed meter casing including:
    (1) a baseplate;
    (2) a first inner cover connected to said baseplate, for housing and protecting selected of said electronic components of said electric utility meter;
    (3) at least a second inner cover for respectively housing and protecting other of said electronic components of said electric utility meter;
    (4) a plurality of inner cover extensions projecting from selected of said inner covers for mutually interconnecting said inner covers; and
    (5) an outer cover enclosing said inner covers and mutually interconnecting with at least one of said inner covers.

21. An electric utility meter as in claim 20, wherein said first inner cover houses at least one of said current transformers.

22. An electric utility meter as in claim 21, wherein said second inner cover houses at least one of said electronic circuit boards.

23. An electric utility meter as in claim 22, wherein said inner cover projections comprise a plurality of locator ribs and snaps for mutually interconnecting selected of said inner covers together.

24. An electric utility meter as in claim 22, further including rivets for connecting said first inner cover to said baseplate.

25. An electric utility meter as in claim 22, further including:

at least one cantilevered spring extending from selected of said inner covers; and at least one containment rib extending from said outer cover for mating with at least one of selected of said corresponding cantilevered springs to restrict movement of said inner covers.

26. An electric utility meter casing as in claim 22, further including a plurality of inner containment ribs extending from selected of said inner covers, securing selected of said inner covers to said outer cover.

27. An electric utility meter as in claim 20, wherein said second inner cover houses at least one of said electronic circuit boards.

28. An electric utility meter as in claim 20, wherein said second inner cover houses two electronic circuit boards, said electronic circuit boards comprising one power supply board and one register board.

29. An electric utility meter casing, comprising:

a baseplate;

a first inner cover utilized for housing and protecting electronic components for an electric utility meter, said first inner cover connected to said baseplate and secured via a plurality of rivets and corresponding rivet bosses;

a second inner cover utilized for housing and protecting additional electronic components for an electric utility meter;

flanges extending from said inner covers, said flanges connected to flanges of adjacent of said inner covers, providing lateral stability;

means for removably securing said second inner cover to said first inner cover, said means including a plurality of locator ribs and snaps extending from said first inner cover;

at least one cantilevered spring extending from said second inner cover;

an outer cover enclosing said inner covers and having at least one outer containment rib for mating with selected of corresponding said cantilevered springs to restrict movement of said inner covers within said electric utility meter casing;

a plurality of inner containment ribs extending from said first inner cover; and at least one projection extending from said outer cover for connecting with selected of said inner containment ribs for securing selected of said inner covers to said outer cover.

30. An electric utility meter casing as in claim 29, wherein said electronic components comprise at least one electronic circuit board and at least one current transformer.

31. An electric utility meter casing as in claim 30, further including a means for capturing at least one of said electronic circuit boards in final meter casing assembly.

32. An electric utility meter casing as in claim 29, wherein said snaps are sandwiched between said outer cover and said flanges, establishing a secured position thereof.

33. An electric utility meter casing as in claim 32, wherein first and second inner covers have rounded corners, providing a predetermined alignment of said inner covers within said outer cover, with a predetermined minimal clearance gap between said inner and outer covers.

34. An electric utility meter casing as in claim 29, further including a plurality of locator pins extending from selected of said inner covers.

35. An electric utility meter casing as in claim 34, further including a plurality of receptacles located on selected of said inner covers for mating with selected of said locator pins and for establishing a predetermined alignment of said inner covers and for providing structural stability of said electric utility meter casing.

36. An electric utility meter casing as in claim 29, further including a mounting element through which one of said rivets is passed before entry into corresponding of said rivet bosses, for mounting of said electric utility meter casing.

37. An electric utility meter casing as in claim 29, further including a pin for positioning and supporting an additional electronic circuit board for use in an electric utility meter.

* * * * *